United States Patent
Schug et al.

(10) Patent No.: US 7,566,155 B2
(45) Date of Patent: Jul. 28, 2009

(54) LED LIGHT SYSTEM

(75) Inventors: Josef Andreas Schug, Wurselen (DE); Joseph Ludovicus Antonius Maria Sormani, Kerkbeemd (NL); Lukas Kuepper, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 171 days.

(21) Appl. No.: 11/573,050

(22) PCT Filed: Aug. 2, 2005

(86) PCT No.: PCT/IB2005/052586

§ 371 (c)(1),
(2), (4) Date: Feb. 1, 2007

(87) PCT Pub. No.: WO2006/016327

PCT Pub. Date: Feb. 16, 2006

(65) Prior Publication Data

US 2008/0068856 A1     Mar. 20, 2008

(30) Foreign Application Priority Data

Aug. 6, 2004  (EP)  ................................... 04103786

(51) Int. Cl.
*F21S 8/10*     (2006.01)

(52) U.S. Cl. ........................ 362/545; 362/231; 362/245; 362/516

(58) Field of Classification Search ................. 362/231, 362/245, 511, 516, 520, 538, 545, 555, 800
See application file for complete search history.

(56) References Cited

U.S. PATENT DOCUMENTS

| 5,084,804 A | 1/1992 | Schairer |
| 6,402,347 B1 | 6/2002 | Maas et al. |
| 6,547,400 B1 | 4/2003 | Yokoyama |
| 2004/0012957 A1 | 1/2004 | Bachl et al. |
| 2004/0085779 A1 | 5/2004 | Pond et al. |

FOREIGN PATENT DOCUMENTS

| DE | 10005795 A1 | 8/2001 |
| DE | 10005795 C2 | 8/2001 |
| DE | 10261183 B3 | 6/2004 |
| EP | 1003064 A1 | 5/2000 |
| FR | 2812071 A1 | 1/2002 |
| WO | 9911968 A1 | 3/1999 |
| WO | 0205351 A1 | 1/2002 |
| WO | 2006033040 A1 | 3/2006 |
| WO | 2006033042 A1 | 3/2006 |

*Primary Examiner*—Stephen F Husar

(57) ABSTRACT

The invention relates to an LED light system (1) for generating directed illumination radiation. The system comprises a plurality of LED lamp elements (2), each comprising a collimator (10) with an LED element (9). The LED lamp elements (2) are arranged in a defined array for generating a specified luminance pattern. A secondary optics device (11) images the luminance pattern in the space to be illuminated.

12 Claims, 2 Drawing Sheets

LED LIGHT SYSTEM

Figure 1:
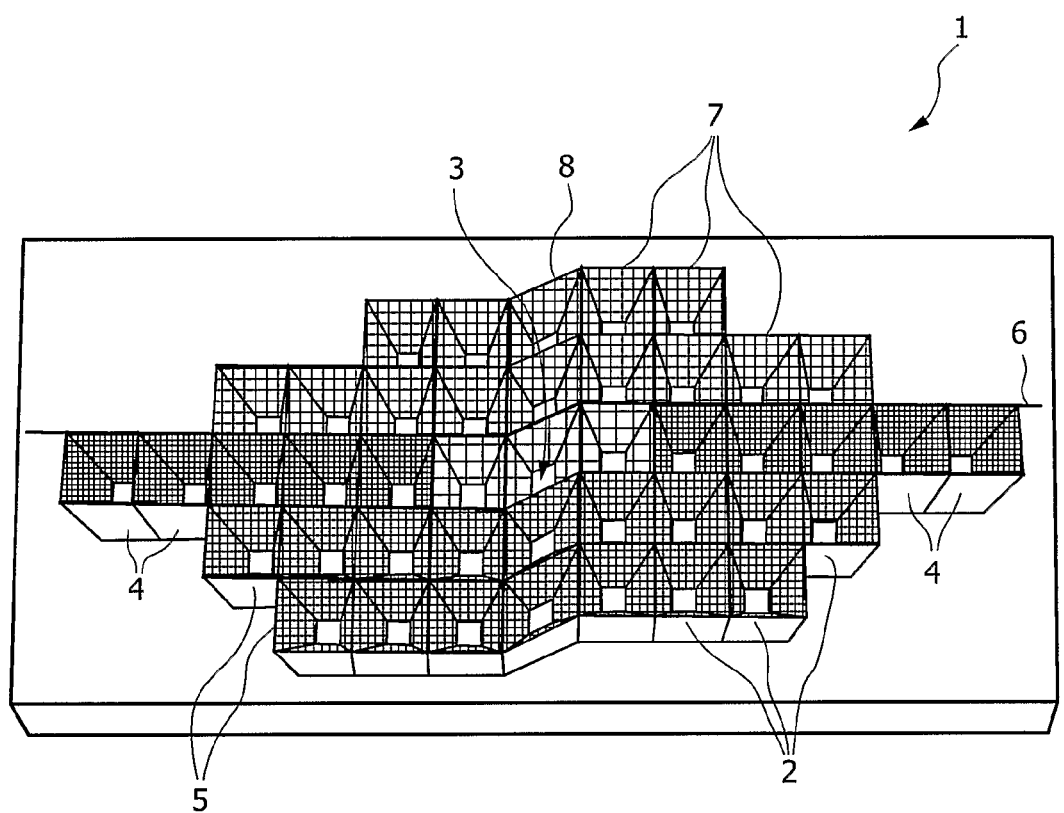

The invention relates to an LED light system with a collimating structure for generating directed, preferably variable illumination radiation, as well as to an LED lamp unit.

In recent years, the technology regarding design and manufacture of inorganic solid LEDs has improved rapidly, up to a stage of development at which inorganic white light-emitting LEDs can be manufactured whose efficiency is higher than 40 lm/Watt. This efficiency distinctly exceeds that of traditional white incandescent lamps (16 lm/Watt) and of most halogen lamps (30-35 lm/Watt) The efficiency of a single LED element has grown in the meanwhile to a level substantially above 100 lm/Watt.

The disadvantages of the LED technology continue to be the comparatively high costs and the requirement for temperature management due to heating of LEDs in operation. Another major problem which both now and in the future will affect the wide usability of LEDs is the relatively limited quantity of light per LED element. This presents problems if a light source with a high brightness is required, e.g. because the emitted light has to be focused in a reflector of small dimensions. A well-known example of this application is the headlight for motor vehicles. For this application, H7 halogen lamps (55 W) are usually used, which emit about 1500 lumens. This quantity of light is radiated with a luminance of over 30 Mcd/$m^2$. In case of a Xenon-HID lamp, the luminance reaches even a value of about 80 Mcd/$m^2$. As against that, an LED element with a radiating surface of 1 $mm^2$ and an emission of 50 Lumens of white light, achieves a luminance of only 8 Mcd/$m^2$, which is many times lower than that of a halogen lamp and even much more lower than that of a conventional HID lamp.

U.S. Pat. No. 6,402,347 describes a device in which individual LED elements are arranged on a common plate and each element is provided with a collimating upper part. A Fresnel lens connected to a respective LED allows the beam from each individual LED to be introduced into a common secondary optical system. The device is used for projectors. The disadvantage of this system resides inter alia in that it exhibits high losses, amounting to about 60%, caused by reflection from the various optical interfaces.

Furthermore, a light device, comprising a light-conducting block in the form of a hollow body with reflective inner walls and a matrix-like arrangement of point light sources such as LED elements, is known from U.S. Pat. No. 6,547,400 B1. The greater part of the light beams radiated by the point light sources is introduced into the guide block and focused there. A considerable part of the beams radiated by the point light sources is, however, not collected by the light-conducting block. This reduces the luminous efficacy of the device considerably. Moreover, in my view, this device is not capable of generating a specific luminance pattern, such as is required, for example, for vehicle headlights.

Compared to that, it is an object of the invention to provide an LED light system especially for automotive applications, by means of which a given luminance pattern can be generated and, if required, varied.

This object is achieved by a LED light system for generating directed illumination radiation, which system has a plurality of LED lamp elements with one collimator each, to which an LED element is assigned. The LED lamp elements are arranged in a definite pattern to generate a given luminance pattern e.g. of different illumination areas. A secondary optics device images the luminance pattern in the space to be illuminated. One collimator each is thus assigned to each LED element in such a light-radiating device. A plurality of LED lamp elements are arranged together in two dimensions, for example in a matrix or honeycomb pattern, such that together they irradiate preferably only one common secondary optics device.

It is assumed hereinbelow that the LED elements are inorganic solid bodies, because they are presently available with sufficient intensity. Notwithstanding this, it is of course possible to alternatively use other electro-luminescent elements, e.g. laser diodes, other light-emitting semiconductor elements or organic LEDs, so long as their performance is satisfactory. The term LED or LED element is therefore to be understood in this document as a synonym for every kind of corresponding electro-luminescent elements.

Instead of a simple LED element with an assigned collimator, other LED lamp elements can be used, e.g. those having an LED element radiating into a chamber, in which case a collimator is arranged at a radiation opening in the chamber. What is important for the invention, however, is only that a plurality of LED lamp elements together form a luminance pattern, with each LED lamp element making an exactly defined contribution to the illumination in the overall luminance pattern.

The invention thus turns away from the conventional design, according to which a plurality of LED elements together generate diffuse radiation, which, in turn, is collected only partially by a secondary optics and focused; the invention thus leaves the hitherto followed trend of development, in which a luminance pattern is formed by superposing light bundles. Rather, it follows the principle of composing the luminance pattern from individual luminous surfaces to be assigned to a respective LED lamp element. It achieves this by collimating the radiation of each individual LED lamp element with the help of an individual collimator. Radiation losses are thus avoided already at the source. The radiation thus collimated is then introduced with a much higher yield into the secondary optics.

According to an advantageous embodiment of the invention, the LED lamp elements additionally are allocated and/or configured in such a manner that the light radiated from the LED lamp elements can be coupled into the secondary optics in a precise manner. An arrangement can be selected for that purpose, in which all outcoupling apertures of the collimators, i.e. their light emission openings, are focused on a common point, e.g. the coupling opening of a lens of a secondary optics. For this purpose, either the longitudinal axes of the collimators can be designed to be inclined to the normal on a base surface of the LED lamp elements or a plurality of LED lamp elements can be arranged next to each other in such a manner that their base surfaces form a curved surface.

The arrangement according to the invention offers also other design options: An advantageous embodiment of the invention proposes a control device by means of which individual LED lamp elements and/or groups of LED lamp elements can be controlled individually within the arrangement for the purpose of setting the luminance pattern. Thus, by virtue of the different connections of the LED lamp elements or groups thereof, a variable luminance pattern can be generated, for example, by switching LED lamp elements on or off or by varying their brightness. There is another design possibility, viz. that of arranging LED lamp elements with different emission characteristics of the light radiated by the relevant LED lamp elements in the LED light system. The emission characteristics can differ in respect of, say, the radiated wavelength range. For example, the colors can vary from ultraviolet, through the colors perceivable by the human eye, up to infrared. Another possibility for different emission characteristics is the dependency of the luminous intensity on the voltage applied to the LED element. Similarly, the emission characteristics can be set by selecting the thickness of a fluorescent layer on the LED element. Devices with the same emission characteristics are arranged preferably by range or as (a) group(s). Depending on the required fineness of the grid, in which the LED lamp elements are arranged, it can be advantageous to have a plurality of LED elements in a LED lamp element. A reduction of the constructional expenditure for collimators may thus be achieved. Besides, LED elements with the same as well as different emission characteristics can be combined in one LED lamp element.

The range-based arrangement of LED lamp elements also offers advantages in design and maintenance: This is because according to another advantageous embodiment of the invention, a plurality of LED lamp elements are combined into one assembly unit. This not only simplifies the effort necessary to control and contact said LED lamp elements, but also facilitates the replacement of—at least partly—damaged assembly units.

The scope of application of such an LED light system according to the invention is multifarious. According to an advantageous embodiment of the invention, the LED light system is a light system for vehicles. The above-mentioned advantages can thus be used advantageously in the automotive sector.

For example, by means of the LED light system as invented, using the luminance pattern, it is possible to generate a low beam having a defined bright-dark boundary ("cut-off"). By virtue thereof, expensive anti-glare, lens or reflector systems are rendered superfluous. Rather, by controlling the LED light system in a specific, range-dependent manner, a low beam or, if required, a high beam or fog light can be generated. An additional advantage of this system is that special secondary optics will not be indispensable for constructing the system, but also secondary optics components such as an aspherical lens can be used, which are used in conventional reflector systems or projector systems with conventional lamps.

According to another advantageous embodiment of the invention, the LED lamp elements are configured and arranged in such a manner that IR-radiation is emitted in certain areas of the luminance pattern. The IR radiation occurs preferably in dark areas, i.e. above the bright-dark boundary and can be used for supporting IR-night vision devices. Alternatively, or additionally, LED lamp elements for fog and/or high beams can also be arranged there.

Another advantageous embodiment of the invention proposes that the collimators of the light-radiating devices or assembly units be filled up at least partially with a transparent material. The transparent material can serve here as optical cement for the LED element(s). In any case, it lends stability to the collimators, thus facilitating also a range-based interchange. In addition, a fluorescent substance that is excited by the light radiation emitted by the LED lamp elements can be applied on or in the transparent material.

Another advantageous embodiment of the invention consists in an LED-lamp unit for an LED light system comprising a plurality of LED lamp elements, wherein the LED lamp elements each comprise one collimator with one LED element, such that one collimator is assigned to each LED lamp element, and wherein the LED lamp elements are mutually firmly linked in a defined arrangement for generating a given luminance pattern. Such an LED lamp unit facilitates design and assembly of the LED light system, because for assembly into the LED light system it requires only one contact interface and only one interface with the secondary optics system. Here too, a plurality of LED elements can be arranged in one LED lamp element.

Furthermore, the lamp unit can in turn be advantageously constructed from a plurality of sub-units. This can advantageously be achieved by combining a plurality of LED lamp elements with the same function in the sub-units. An advantage of such a functional grouping is that it has only one mechanical and/or electrical interface for a number of, notably functionally equivalent, LED lamp elements. This facilitates the substitution of individual sections, for example those particularly subjected to stress, and reduces the cost for repairs on the LED lamp unit.

These and other aspects of the invention are apparent from and will be elucidated, by way of non-limitative example, with reference to the embodiment(s) described hereinafter. In the drawings, FIG. 1: shows a lamp unit in accordance with the invention, FIG. 2: shows an arrangement of LED lamp elements as a component of a lamp unit, FIG. 3: shows the interaction of a lamp unit and a secondary optics system.

FIG. 1 shows a lamp unit 1 comprising 43 individual LED lamp elements 2. They are collated in a two-dimensional array according to a specified luminance pattern, in such a manner that they generate a defined bright-dark area when in operation. For this purpose, three LED lamp elements 3 are centrally arranged, which emit a light spectrum that tends towards yellow. In FIG. 1 they are represented by means of a coarse cross-hatched pattern. As against that, LED lamp elements 4 with a high blue content are arranged in the edge zones and symbolized by a tight hatching. In between and below said LED lamp elements, LED lamp elements 5 are grouped with intermediated radiation characteristics of both yellow and blue. Above the row of yellow LED lamp elements 3 and blue LED lamp elements 4, i.e. above the line 6, the lamp unit 1 forms a bright-dark boundary, where the LED lamp elements 7 arranged above the line 6 do not radiate any visible light. They can radiate infrared light and can be used for supporting night-vision devices.

To illustrate the design possibilities offered by the invention, the base surfaces of lamp elements 2 are formed so as to be diamond-shaped in a vertical row 8 forming a central axis of the lamp unit 1 are illustrative of. A deflected path of the line 6 can thus be achieved.

The LED lamp elements 3, 4 and 5 together produce a luminance pattern required for vehicle headlights, with a central area of high brightness directly on the bright-dark boundary. Each of the LED lamp elements 3, 4, 5 contributes its share by forming its own section of the total pattern. The luminance pattern defined for motor vehicle headlights thus is not formed by superimposing the light cones from a plurality of light systems, but in that exactly defined light cones illuminating separate spatial areas are added essentially next to each other so as to form a luminance pattern.

Figure 2:
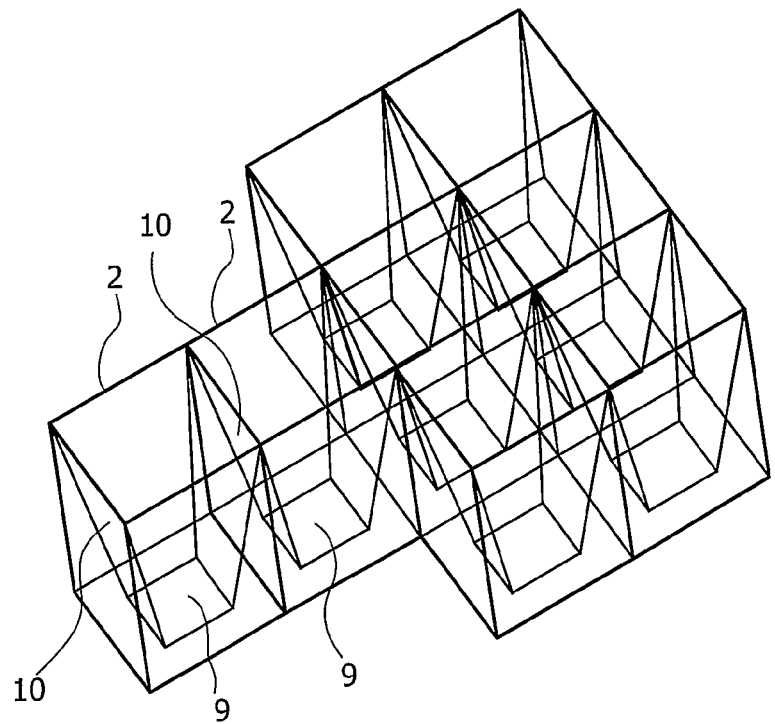

FIG. 2 shows a section of the lamp unit 1 comprised of eight LED lamp elements 2. Each LED lamp element 2 comprises an LED element 9, to which a collimator 10 is assigned. In principle, the collimators 10 can have any shape. Especially preferred are collimators with a truncated pyramid shape having such a cross section or such a base surface that the LED lamp elements can border directly on each other, preferably on each side. Particularly preferably, these are truncated pyramid-shaped collimators 10, as shown in FIG. 2, with a rectangular or parallelogram-shaped cross section, to be able to arrange the LED lamp elements 2 directly next to each other in order to save space. Then, in addition, a plurality of collimators 10 of neighboring LED lamp elements 2 can easily be combined so as to form a grid.

In the arrangement in accordance with the invention, it is not only possible to lend an individual radiation characteristic to each lamp element 2, but also to separately control each LED lighting element 2 and to regulate its brightness individually even during operation. This allows the creation of a variable luminance pattern. Each LED lamp element 2 can, besides, be replaced separately or as part of a group of lamp elements together forming small sub-units. This occurs predominantly in the case of a functional grouping of a plurality of LED lamp elements 2, e.g. forming one IR-sub-unit.

Instead of the LED lamp elements 2 shown here, of course, also LED lamp elements of another design can be arranged. For example, the exit surface of a chamber of an LED lamp element with collimator and chamber, in which one or more LED elements are arranged, can come in place of the LED element 9.

Figure 3:
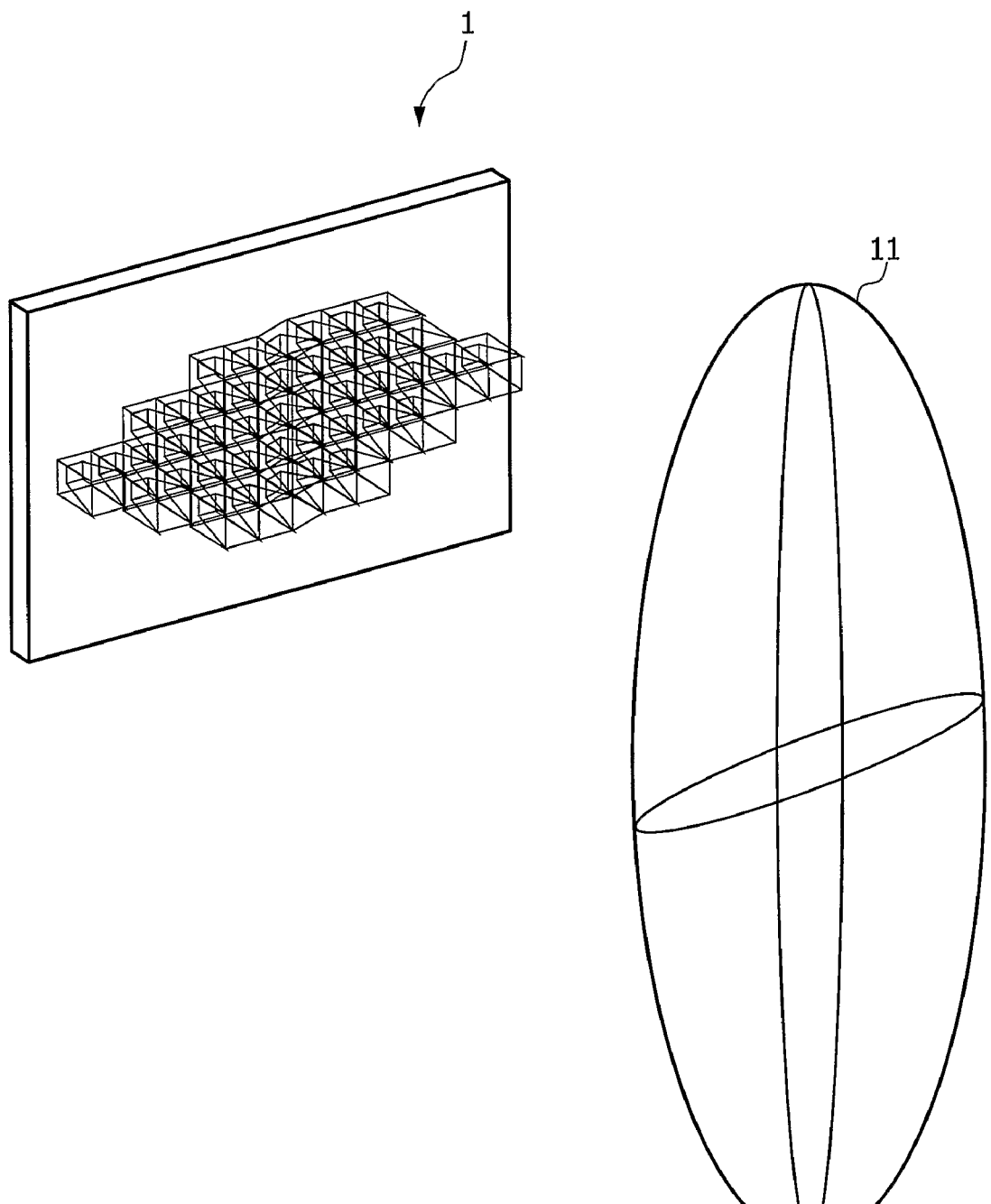

FIG. 3 shows the interaction of a lamp unit 1 and a lens 11 as secondary optics. The image generated by the lamp unit 1 is projected, by the lens, in the space to be illuminated in such a manner as to be mirrored around a horizontal axis. The lamp unit 1 is therefore arranged in a position rotated by 180° around a horizontal axis with respect to FIG. 1.

Summarizing, it is pointed out once more that these systems and methods, illustrated in the Figures and the description, are only examples of embodiments, which can be modified to a large extent by a person skilled in the art, without leaving the framework of the invention.

Moreover, it is pointed out for the sake of completeness, that the use of the indefinite article "a" or "an" does not exclude the presence of a plurality of the relevant items.

The invention claimed is:

1. An LED light system for the generation of directed illumination radiation, comprising a plurality of LED lamp elements, each LED lamp element comprising a collimator with an LED element, each LED lamp element designed to produce a defined cone of light, the LED lamp elements being arranged in a defined manner in a luminous surface, the cones of light produced by said plurality of LED lamp combining to generate a specified luminance pattern, a single secondary optics device that images the luminance pattern in the space to be illuminated, wherein the cone of light produced by each LED lamp element of said plurality of LED lamp elements is directed at the secondary optics device.

2. An LED light system as claimed in claim 1, characterized in that the LED lamp elements are arranged in such a manner that the light radiated by the LED lamp elements can be specifically directed at and coupled into the secondary optics device.

3. An LED light system as claimed in claim 1, including a control device for controlling each of the LED lamp elements or groups of the LED lamp elements within the arrangement so as to set the luminance pattern.

4. An LED light system as claimed claim 1, wherein the LED lamp elements have different emission characteristics.

5. An LED light system as claimed in claim 1, wherein a plurality of LED elements is arranged in each of the LED lamp elements.

6. An LED light system as claimed in claim 1, wherein a plurality of LED lamp elements are combined in one assembly unit.

7. An LED light system as claimed in claim 1, wherein the LED light system is a vehicle light system.

8. An LED light system as claimed in claim 1, wherein the luminance pattern is designed to generate a low beam with a defined bright-dark cut-off.

9. An LED light system as claimed in claim 1, wherein the luminance pattern is designed so as to emit IR-radiation from predetermined areas of the pattern.

10. An LED light system as claimed in claim 1, wherein the collimators of the LED lamp elements are filled at least partially by a transparent material.

11. An LED light system as claimed in claim 1, the LED lamp elements being interlinked in a definite arrangement for generating a specified luminance pattern.

12. An LED light system as claimed in claim 11, wherein the LED light system is sub-divided into a plurality of sub-units, each having separate mechanical or electrical interfaces.

* * * * *